US012571844B2

(12) United States Patent
Liu

(10) Patent No.: US 12,571,844 B2
(45) Date of Patent: Mar. 10, 2026

(54) ROBUST FAULT FREQUENCY COMPONENT EXTRACTION OF MOTOR UNDER VARYING OPERATING CONDITIONS

(71) Applicant: Mitsubishi Electric Research Laboratories, Inc., Cambridge, MA (US)

(72) Inventor: Dehong Liu, Cambridge, MA (US)

(73) Assignee: Mitsubishi Electric Research Laboratories, Inc.

( * ) Notice: Subject to any disclaimer, the term of this patent is extended or adjusted under 35 U.S.C. 154(b) by 435 days.

(21) Appl. No.: 18/058,406

(22) Filed: Nov. 23, 2022

(65) Prior Publication Data

US 2024/0175923 A1 May 30, 2024

(51) Int. Cl.
*G01R 31/34* (2020.01)
*G01M 13/028* (2019.01)
(52) U.S. Cl.
CPC ......... *G01R 31/343* (2013.01); *G01M 13/028* (2013.01)
(58) Field of Classification Search
None
See application file for complete search history.

(56) References Cited

U.S. PATENT DOCUMENTS

| | | | |
|---|---|---|---|
| 2012/0327745 A1* | 12/2012 | Yardibi | .............. G01R 31/1209 367/121 |
| 2016/0282416 A1* | 9/2016 | Choi | .................... G01R 31/343 |
| 2017/0307689 A1* | 10/2017 | Muramatsu | .......... G01R 31/343 |
| 2017/0338874 A1* | 11/2017 | Pratt | .................... H04B 7/0862 |
| 2019/0129026 A1* | 5/2019 | Sumi | .................. G01S 7/52041 |
| 2019/0324084 A1* | 10/2019 | Bazzi | .................. G01R 31/343 |

OTHER PUBLICATIONS

Cabada et al. Fault detection in rotating machines with beamforming: Spatial Visualization of diagnosis features, Mechanical Systems and Signal Processing, vol. 97, Jan. 23, 2014. pp. 33-43.

* cited by examiner

*Primary Examiner* — Nasima Monsur
(74) *Attorney, Agent, or Firm* — Gene Vinokur

(57) ABSTRACT

A fault detection system of extracting fault signature of a motor operating at varying speed or varying load conditions is provided. The fault detection system includes a sensor interface configured to acquire sensor signals from sensors arranged at predetermined positions of the induction machine, wherein the sensor signals are indicative of an eccentricity level of a rotor of the induction machine, a memory coupled with a processor. The instructions include steps a sensor interface configured to acquire operation signals of the induction machine; a memory configured to store a computer-implemented fault detection method by extracting fault signals in the frequency domain from the frequency spectrum formed by a minimum variance beamforming method.

16 Claims, 9 Drawing Sheets

Eccentric 106 rotor 104 stator

Healthy: co-axial 106 rotor 104 stator

ROBUST FAULT FREQUENCY COMPONENT EXTRACTION OF MOTOR UNDER VARYING OPERATING CONDITIONS

FIELD OF THE INVENTION

The present invention is related to a system for extracting fault signatures of motors operating under varying speed or varying load conditions, based on motor current signature analysis.

Background & Prior Art

Motor current signature analysis (MCSA) has been a prevailing method during the past decades for detecting motor faults such as bearing fault, eccentricity, and broken-bar fault, etc. When any kind of these motor faults occurs, the rotating flux in the air gap becomes asymmetric, and consequently induces extra frequency components in the stator current. MCSA-based fault detection methods aim to extract fault signatures in the frequency domain by analyzing the stator current.

In practice, the extraction of fault frequency components can be very challenging due to the following reasons. First, motor fault frequency components are generally much weaker than the operating frequency component, especially at the early stage of motor fault development. Second, the weak fault signature can be easily submerged in the background noise or interference. For example, when the motor is driven by an inverter, its fault signature may be interfered by harmonics of the power electronic devices due to their switching operations. Third, motors are generally operating in varying load and varying speed conditions. The non-periodic time varying factor will inevitably introduce spectrum distortion in MCSA. Therefore, it is desirable to develop a robust fault signature extraction method for motors under varying operating conditions to effectively extract fault signatures from noisy measurements.

Frequency spectral analysis is a classic signal processing problem and widely used in all kinds of applications. The most common spectral analysis method in MCSA-based fault detection is the Fourier transform for its simplicity. This method works well in most cases when the motor under test is operating at a steady status, but not very satisfactory for varying-load operations. For varying-load operations, a straightforward way is to measure multiple time sequences and take the average such that the influence of noise and varying operations can be averaged down. This method however requires longer time measurements and may not work effectively for extracting small fault signatures. Other advanced signal-processing methods such as ESPRIT, MUSIC, and compressive sensing (CS), etc., are introduced by researchers to the motor fault detection community to achieve high-resolved spectrum. However, these methods are either sensitive to noise or heavily relying on the signal model. A low noise level or a small load fluctuation that occurred during the measurement period could interfere the accuracy of fault detection.

Accordingly, there is a need of a robust method for extracting fault signature of motors operating under varying speed or varying load conditions.

SUMMARY OF THE INVENTION

Motor current spectrum analysis (MCSA) has been widely used in motor fault detection including bearing fault, broken-bar, and eccentricity, etc. When a motor's fault is in its early stage or a faulty motor is operating in varying load conditions, fault signature may be submerged in the background noise and interference, making fault detection a very challenging problem. Some embodiments of the present invention provide a method and a system that extract small fault signatures of frequency components under varying load conditions and with strong background noise. To this end, we segment time-domain current measurements into overlapped sequences, and treat these sequences as measurements of a linear sensor array accordingly. We then employ the idea of minimum variance beam-forming in array signal processing to generate the current spectrum with robust performance under varying load operations. We demonstrate our method with experimental data collected on a motor with a minor eccentricity fault operating in practical varying conditions.

Some embodiments of the present invention provide a minimum variance-based spectrum analysis method (minimum variance beam-forming method) to extract frequency components of early-stage motor faults with varying operation conditions. The minimum variance beam-forming method minimizes the noise variance of spectrum at each frequency. Therefore, in the final frequency spectrum, noise related frequency components will be suppressed while frequency components of signals including the fault signal will be kept. Experimental results validate our method in extracting fault signature in noisy measurements.

It is an object of some embodiment to provide a system and a method suitable for extracting fault signatures of motor operating at varying speed or varying load conditions. Motivated by array signal processing methodologies, we propose to use the minimum-variance beam-forming method to perform motor current spectral analysis. The detailed idea is described as follows. We first segment the time-domain stator current under test into multiple overlapped time sequences with a fixed time shift. Each sequence is treated as an independent measurement of an imaginary current sensor. Since the time difference between adjacent sequences is identical, these imaginary sensors form a linear imaginary sensor array. The spectrum analysis problem is then converted to a beam-forming problem of a linear array in the frequency domain. We borrow the idea of the minimum-variance (MV) beam forming method from array signal processing techniques to improve the detection performance under noisy measurements. Due to the variation of motor operating conditions, each sensor has a different and unknown frequency-dependent gain factor. MV-based spectrum analysis aims to achieve a robust spectrum by using a weighted sum of spectrum of each time sequence, where the weights are frequency-dependent and optimized by minimizing the noise variance of the output spectrum.

To validate our proposed method, we take the motor eccentricity issue as an example to perform MCSA-based fault detection. In particular, a motor with a minor eccentricity fault is considered in our experiments and a magnet powder brake is mounted with the motor as its load. The motor stator current is then measured under various load conditions by changing the input current of the magnet powder brake. By comparing MCSA results on the experimental data using different methods, we demonstrate that our method can effectively extract fault frequency components under varying load conditions even under strong noise interference.

According to some embodiments of the present invention, a fault detection system is provided for extracting fault signatures of an induction machine operating at varying load or varying speed conditions. The fault detection system may include a sensor interface configured to acquire operation signals of the induction machine; a memory configured to store a computer-implemented fault detection method; a digital signal processor configured to perform steps of the computer-implemented fault detection method by using the acquired operation signals via the sensor interface, wherein the steps comprises: segmenting the operation signals by time-windows into N segments, wherein the segmenting is performed for each of the N segments to include overlapped time periods between neighboring segmented operation signals; converting each of the segmented operation signals into N frequency domains; shifting a phase of each of the segmented operation signals by a preset phase; performing a beam-forming method for the converted segmented operation signals, wherein each of the converted segmented operation signals is applied by optimized weight factors; and extracting fault signals in the frequency domain from the frequency spectrum formed by a minimum variance beam-forming method.

Further, some embodiments of the present invention provide a computer-implemented fault detection method for extracting fault signatures of an induction machine operating at varying load or varying speed conditions. The method includes steps of: acquiring operation signals of the induction machine via a sensor interface connected to a current sensor arranged in the induction machine; segmenting the operation signals by time-windows into N segments, wherein the segmenting is performed for each of the N segments to include overlapped time periods between neighboring segmented operation signals; converting each of the segmented operation signals into N frequency domains; shifting a phase of each of the segmented operation signals by a preset phase; performing a beam-forming method for the converted segmented operation signals, wherein each of the converted segmented operation signals is applied by optimized weight factors; and extracting fault signals in the frequency domain from the frequency spectrum formed by a minimum variance beam-forming method.

BRIEF DESCRIPTION OF THE DRAWING

The accompanying drawings, which are included to provide a further understanding of the invention, illustrate embodiments of the invention and together with the description serve to explain the principle of the invention. The drawings shown are not necessarily to scale, with emphasis instead generally being placed upon illustrating the principles of the presently disclosed embodiments.

DETAILED DESCRIPTION OF THE PREFERRED EMBODIMENTS

Figure 1A:
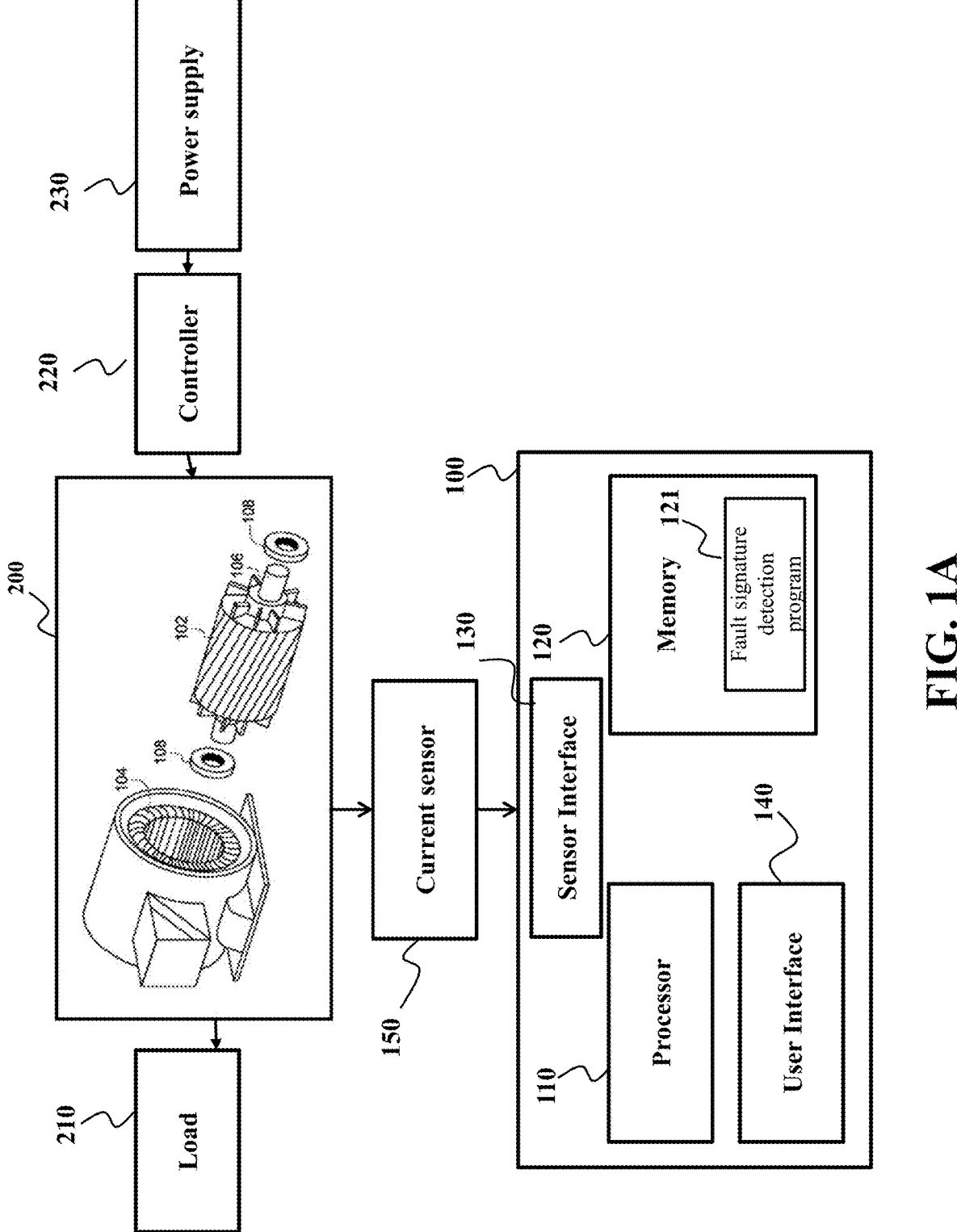
FIG. 1A is a schematic of a fault detection system for controlling and monitoring an induction motor according to one embodiment of an invention.

Various embodiments of the present invention are described hereafter with reference to the figures. It would be noted that the figures are not drawn to scale elements of similar structures or functions are represented by like reference numerals throughout the figures. It should be also noted that the figures are only intended to facilitate the description of specific embodiments of the invention. They are not intended as an exhaustive description of the invention or as a limitation on the scope of the invention. In addition, an aspect described in conjunction with a particular embodiment of the invention is not necessarily limited to that embodiment and can be practiced in any other embodiments of the invention.

FIG. 1A is a schematic of a fault detection system 100 for controlling and monitoring an induction motor according to one embodiment of an invention.

The induction motor (system) 200 includes a rotor assembly 102, a stator assembly 104, a main shaft 106, and two main bearings 108. In this example, the induction motor 200 is a squirrel-cage induction motor.

The controller 220 is powered by power supply 230 and can be used for monitoring and controlling the operation of the induction motor 200 in response to various inputs in accordance with embodiments of the present invention. For example, the controller 220 connected to the induction motor 200 can control the speed of the induction motor based on inputs received from the fault detection system 100 configured to acquire data pertaining to operating conditions of the induction motor 200 from the current sensor 150, acquiring stator current data to the induction motor 200. For example, the current sensor senses current data from one or more of the multiple phases of the induction motor. More specifically, in the case of the induction motor is a 3-phase induction motor, the current sensor senses the current data from the three phases of the 3-phase induction motor. While certain embodiments of the present invention will be described with respect to a multi-phase induction motors, other embodiments of the present invention can be applied to other multi-phase electromechanical machines.

Some embodiments of the present invention describe a system for fault detection in an electric machine, such as the induction motor 200. The system configured for detection includes a fault-detection circuitry module 100 for detecting the presence of a faulty condition of a rotor 102, including eccentricity fault, broken bar fault, eccentricity fault, etc., within the induction motor assembly. In one embodiment, the fault detection circuitry module 100 is implemented as a sub-system of the controller 220. In some cases, the fault-detection circuitry module 100 can be referred to as a fault detection system. In alternative embodiment, the fault-detection circuitry module 100 is implemented using a separate processor. The fault-detection circuitry module 100 may be a hardware circuit module that is operatively connected to the controller 220. In some implementations the fault-detection circuitry module 100 and the controller 220 can share the information. For example, the fault detection circuitry module 100 can reuse sensor data used by the controller to control the operation of the induction motor.

Further, the fault-detection circuitry module 100 includes a processor 110, a memory 120, a fault detection program (computer-implemented fault detection method) stored in the memory 120 when the instructions of the program are performed by the processor 110. The circuitry module 100 further includes a sensor interface 130 configured to acquire signals from the sensors 150. The sensor interface 130 includes A/D (analog/digital) and A/D (analog/digital) coverts to perform data communication with the processor 110, the memory 120, the fault detection program, a user interface 140 and the current sensor 150. The processor 110 is a digital signal processor designed to perform the steps of the fault detection program while acquiring the digital signal of stator current (motor current) of an induction motor from the current sensor 150 via the sensor interface 130.

The processor 110 may be multiple processors, and the memory 120 may be a memory module that includes multiple memories. The user interface 140 is configured to connect to a keyboard and a display unit configured indicate the normal/fault status information of the induction motor 200 in response to the output of the fault-detection module 200.

Figure 1B:
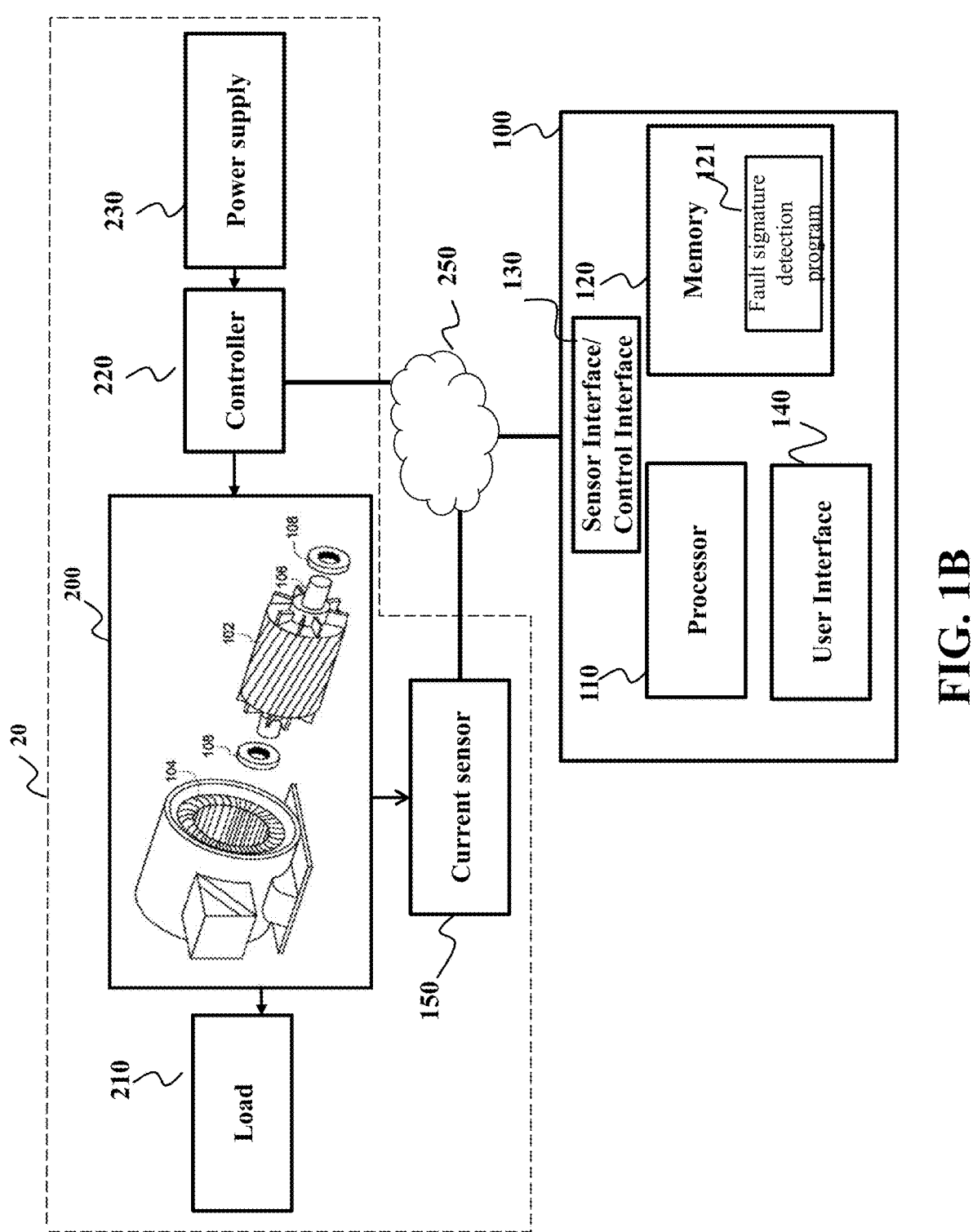
FIG. 1B is a schematic of a fault detection system operated by a user (operator) via a network for controlling and monitoring an induction motor according to one embodiment of an invention.

FIG. 1B is a schematic of a fault detection system operated by a user (operator) via a network 250 for controlling and monitoring an induction motor according to one embodiment of an invention. In this case, the fault-detection module 100 may be included in an operating system of induction motors located at the site of the user/operator. When the fault-detection module 100 determines that a fault is caused based on the sensor signals of the sensors 150 via the network (communication network) 250 during the operation of the induction machine (induction motor) 200, the fault-detection module 100 can transmit a control signal via the network 250 to slow down or stop driving the induction motor 200 based on a preprogrammed algorithm (not shown in the figure) stored in the memory 120. In some cases, the calibration of the current sensor 150 can be performed based on the sensor calibration program (not shown in the figure) stored in the memory of fault-detection module 100. In some cases, the network 250 may be an optical fiber network, a wireless network, an internet network, or a data communication network consisting of at least two combinations among the optical fiber network, the wireless network, and the internet network.

This configuration can be a maintenance system managed by a user/client, who operates the induction machine system 20 separately located from the site of the induction machine. For instance, this system configuration can be used for a power generating system operated by a user, and a train system for controlling the induction motors driving the trains. In some cases, when the fault-detection module 100 detects a site of the induction machine is separated from a site of the fault detection system, the data communication between the site of the induction machine and the site of the fault detection system is performed via a network. The network 250 may be an optical fiber network, a wireless network, an internet network, or a data communication network consisting of at least two combinations among the optical fiber network, the wireless network, and the internet network.

Further, the fault detection system is included as part of a maintenance system of a user. When the determined eccentricity level of the induction machine is equal to or greater than a critical threshold level, the fault detection system transmits a control signal to a controller of the induction machine via a network using the sensor interface/control interface 130 to stop operating the induction machine.

In one embodiment of the invention, the current and voltage sensors respectively detect stator current data from the stator assembly 104 of the induction motor 200. The current data acquired from the current sensor is communicated to the inverter for control and to the fault detection module for further processing and analysis. The analysis includes performing motor current signature analysis (MCSA) to detect faults within the induction motor 200. In some embodiments, upon detecting the fault by using the fault-detection module 100, the controller 220 receives a fault detection signal via the interface 130 of the fault-detection module 100 stops the operation of the induction motor by transmitting an interrupting signal of the stator current of the induction motor 200 to the controller 110 for further inspection or repair. In some cases, the current sensor 150 may include a controller interface (not shown) that is configured to receive the fault detection signal from the interface 130 and transmit the fault state signal to the controller 220 such that the controller 220 interrupts the stator current of the induction motor 200 for stopping the operations of the induction motor 200. When the current sensor 150 does not include the controller interface, the interface 130 may be configured to connect to the controller 220 such that the controller interrupts the stator current of the induction motor 200 for stopping the operations of the induction motor 200 in response to the fault detection signal from the fault-detection circuitry module 100 via the interface 130.

The system also includes a memory for storing the measurements of the signal and various parameters and coefficients for performing a fault severity detection method.

Figure 2B:
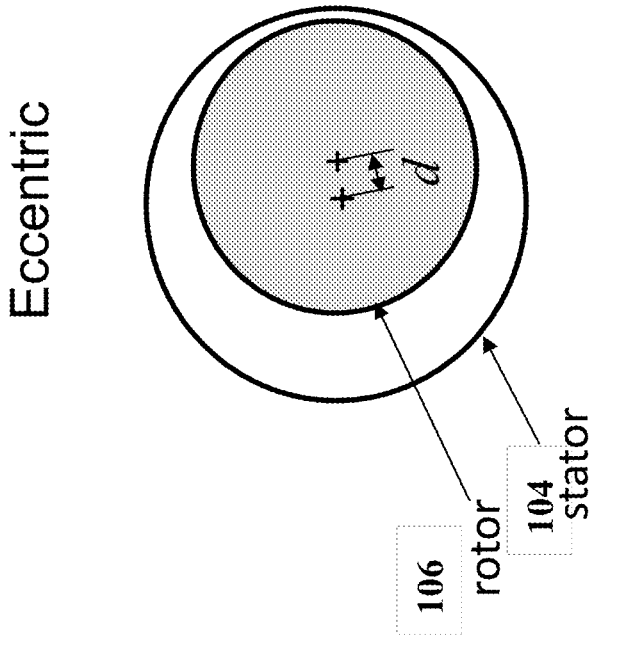
FIG. 2A and FIG. 2B are diagrams of healthy motor with uniform airp gap and eccentric motor with non-uniform air gap according to one embodiment of the invention.
Figure 2B:
Figure 2A:
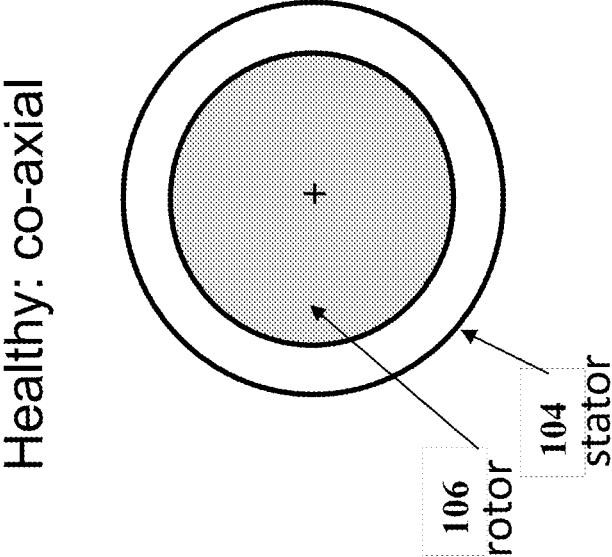

FIG. 2A and FIG. 2B are diagrams of a healthy motor with uniform air-gap and a faulty motor with eccentricity fault indicated by non-uniform airgap respectively, according to one embodiment of the invention. Based on our physical model of induction machines and fault detection methods using different features, we aim to extract fault signature of a motor operating at varying speed or varying load conditions.

Motor current signature analysis (MCSA) has been widely used in motor fault detection for decades because of its effectiveness and noninvasive property. Based on the stator current frequency spectrum, MCSA methods aim to extract characteristic frequency components for different types of faults.

For example, when there exists a broken bar fault in a squirrel-cage induction motor, a set of new frequency components besides the operating frequency component appear in the spectrum of stator currents, $$f_{bar} = (1 \pm 2ks)f_s, \qquad (1)$$

where $k = 1, 2, \ldots$ ; s is the slip; and $f_s$ is the fundamental supply frequency. MSCA-based broken-bar fault detection techniques focus on detecting the dominant frequency component in the stator current, which is $f_{b1} = (1-2s)f_s$.

For bearing fault, depending on the fault location or fault type in the bearing, some periodic vibration pulses are generated as a result of the impact, and consequently a characteristic frequency $f_c$ is induced in the stator current. For different types of bearing fault mentioned above, $f_c$ is listed as follows.

Cage defect hits outer race:

$$f_{co} = \frac{f_r}{2}\left(1 - \frac{d}{D}\cos\theta\right),$$ (2)

Cage defect hits inner race:

$$f_{ci} = \frac{f_r}{2}\left(1 + \frac{d}{D}\cos\theta\right),$$ (3)

Outer race defect hits balls:

$$f_o = N_b\frac{f_r}{2}\left(1 - \frac{d}{D}\cos\theta\right),$$ (4)

Inner race defect hits balls:

$$f_i = N_b\frac{f_r}{2}\left(1 + \frac{d}{D}\cos\theta\right),$$ (5)

Ball defect hits both races:

$$f_b = \frac{Df_r}{2}\left(1 - \frac{d^2}{D^2}\cos^2\theta\right),$$ (6)

where $f_r$ is the mechanical frequency of the rotor, d is the ball diameter, D is the pitch or cage diameter, $N_b$ denotes the number of balls, and $\theta$ is the contact angle characterizing the point of contact between the ball and the raceway.

For eccentricity fault in most induction machines, the fault signature frequency in the current signal is $$f_{ecc} = \left((kR \pm n_d)\frac{1-s}{p} \pm v\right)f_s,$$ (7)

where R is the number of rotor slots, p is number of pole pairs, k is any positive integer, $n_d$ is the eccentricity order ($n_d=0$ in case of static eccentricity and $n_d=1, 2, 3, \ldots$, in case of dynamic eccentricity), and v is the order of stator time harmonics. Without the number of rotor slots, a simplified version is given by $$f'_{ecc} = \left[1 \pm m\left(\frac{1-s}{p}\right)\right]f_s = f_s \pm mf_r,$$ (8)

$$f_r = \frac{1-s}{p}f_s$$

where is the rotor frequency related to the rotational speed.

Therefore, for most motor fault detection problems, the objective of MCSA-based methods is to extract the corresponding fault signature components via effectively frequency spectral analysis. Once a fault frequency component over a certain threshold is detected, it is claimed that there exists a corresponding fault. The fault severity level can be further estimated depending on the magnitude of the fault frequency component as well as other operating conditions.

Frequency spectrum analysis is a classic problem in signal processing. Let $i_s$ (t) represent the time-domain stator current of a motor in an ideal steady-state operation. Note that the current could be a single phase current or a combination of three phase current after proper phase alignment such as Park transform. For the healthy motor, the time-domain stator current can be represented as $$i_{sh}(t)=I_s\cos(2\pi f_s t+\phi_s);$$ (9)

where $I_s$ is the stator current amplitude related to the motor load condition, $f_s$ is the operating frequency, and $\phi_s$ is the initial phase of the operating frequency component.

When there exists a motor fault, the motor current signal includes extract frequency components $$i_{sf}(t)=i_{sh}(t)+\Sigma_k I_{f,k}\cos(2\pi f_{f,k}t+\phi_{f,k}),$$ (10)

where $I_{f,k}$ represents the magnitude of the kth fault frequency component $f_{f,k}$ and $\phi_{f,k}$ is the initial phase of the kth fault frequency component.

The frequency spectrum of the stator current $i_s(t)(=i_{sh}(t)$ or $i_{sf}(t)$ depending on the health condition) can be achieved by the Fourier transform as $$I_s(\omega)=\int i_s(t)e^{-j\omega t}dt.$$ (11)

For periodic signals in motor operations, a discrete Fourier transform (DFT) is typically used to compute the Fourier spectrum based on discrete time samplings is (n). We ignore the detailed correspondence between the frequency and the sampling rate, and simplify the expression of Fourier spectrum as $$\hat{S}_F(\omega)=DFT[i_s s(n)].$$ (12)

Note that the fault signature component is typically very weak compared to the operating signal, and the value of $I_{f,k}$ could be 40 dB to 60 dB lower than that of Is, depending on the fault type and the fault severity. Therefore, it is very common that the fault signature component is interfered by the operating signal or other noise, especially under varying operating conditions.

Figure 4:
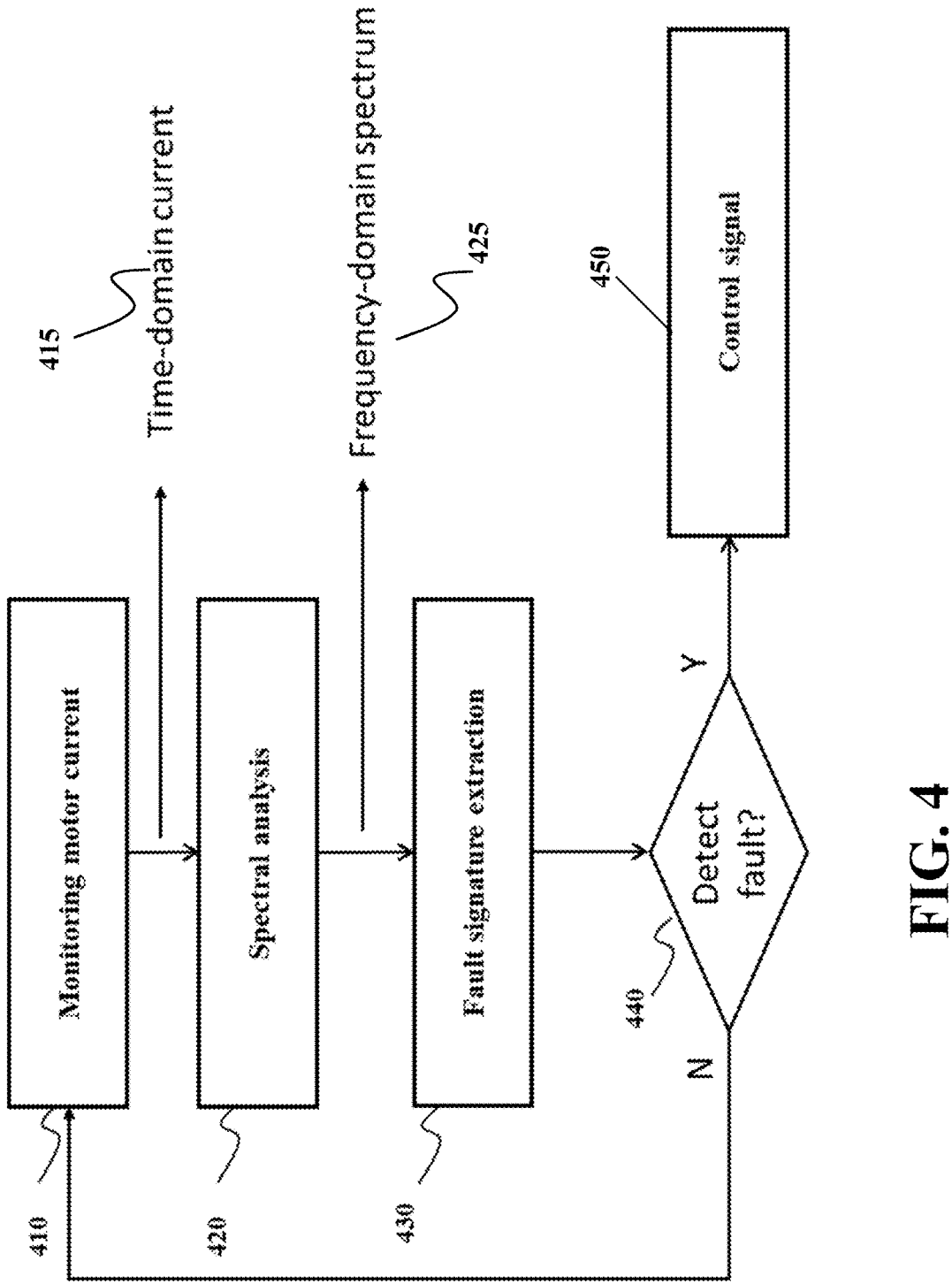
FIG. 4 shows a block diagram of a system for MCSA-based fault detection of rotor faults according to one embodiment of the invention.
Figure 5:
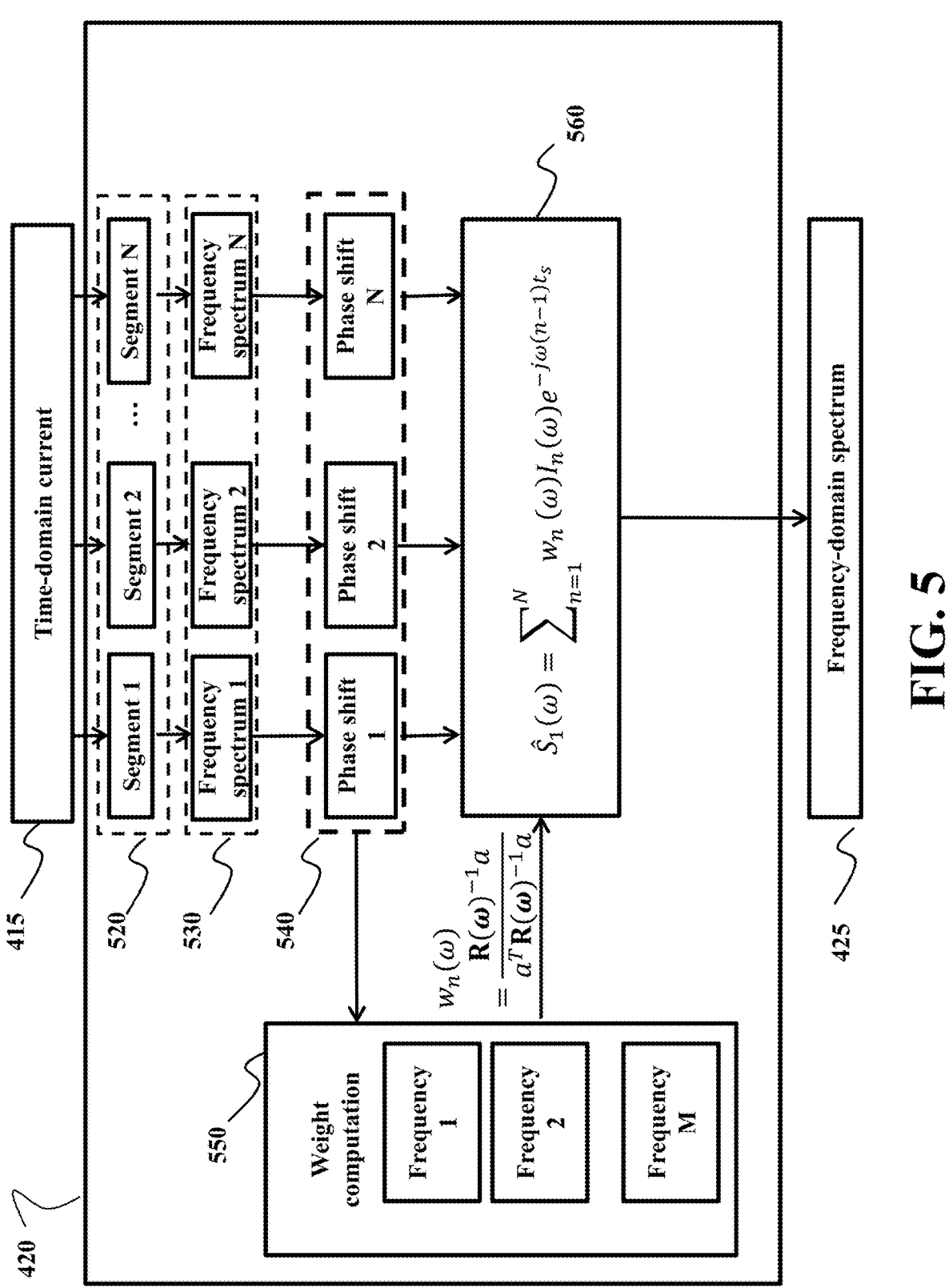
FIG. 5 shows a block diagram of a detailed robust spectrum analysis method according to one embodiment of the invention.

FIG. 4 shows a block diagram of a computer-implemented fault signature/signal detection method/program 121 for MCSA-based fault detection of rotor faults and FIG. 5 shows a block diagram of a detailed robust spectrum analysis method according to some embodiments of the invention. The computer-implemented fault signature/signal detection method 121 is stored in a memory 120 or storage (not shown) and is configured to run by the processor 110 while the system performs the fault detection of an induction machine 200.

Under varying load conditions, the stator current amplitude $I_s$ is not a constant any more, but varying with the load condition. In such situations, the performance of fault detection via simple DFT will be degraded since the small fault component could be submerged into the background noise. To effectively analyze the stator current spectrum, we introduce a parameter $\alpha(t)$ to reflect the impact of varying load, and express the practical measurement of time-domain stator current 415 as $$i(t)=\alpha(t)\otimes i_s(t)+v(t)$$ (13)

where $\alpha(t)$ is a time-domain function showing the impact of varying load, v(t) is measured noise, and $\otimes$ is the convolution operation. In the frequency domain, we have $$I(\omega)=A(\omega)S(\omega)+V(\omega);$$ (14)

where $I(\omega)$ and $S(\omega)$ stand for the Fourier spectrum of $i(t)$ and $i_s(t)$ respectively. Our objective is then to estimate $S(\omega)$ 425 from measurement $i(t)$ 415 through spectral analysis 420 such that the fault signature in $S(\omega)$ 425, if there is any, can be extracted effectively.

A straightforward way to estimate $S(\omega)$ is to average multiple spectra to reduce the impact varying load. Assume that we have a serial of N equal-length time sequences $\{i_1(t), i_2(t), \ldots, i_n(t), \ldots, i_N(t)\}$ 520. The frequency spectrum of each sequence 530 can be represented by $$I_n(\omega) = \int i_n(t)e^{-j\omega t}dt \approx A_n(\omega)S_n(\omega) + V_n(\omega) \tag{15}$$

Note that $A_n(\omega)$ is the Fourier spectrum of $\alpha_n(t)$ due to varying loads as mentioned before. Specially, when the motor is operating at steady status with a constant load and a constant speed, $A_n(\omega)$ is a constant. Otherwise, $A_n(\omega)$ varies due to the varying operation. The averaged spectrum is given by $$\hat{S}_{avg}(\omega) = \frac{1}{N}\sum_n |I_n(\omega)| = \frac{1}{N}\sum_n |A_n(\omega)S_n(\omega) + V_n(\omega)|. \tag{16}$$

To make use of array signal processing techniques, we generate N time sequences $\{i_1(\tau), i_2(\tau), \ldots, i_n(\tau), \ldots, i_N(\tau)\}$ by putting a sliding time window on the measured current $i(t)$, where the $n^{th}$ time sequence $i_n(\tau)$ can be expressed as $$i_n(\tau) = i(t+(n-1)t_s) \text{ for } \tau \in [0; t_w], \ n=1, \ldots, N \tag{17}$$

Here $t_w$ is the window size in time, and $t_s$ is the time step between two consecutive time windows. The frequency spectrum of each segment can be represented by the spectrum of the first sequence with proper phase shift as $$I_n(\omega) = \int i_n(\tau)e^{-j\omega\tau}d\tau \tag{18}$$
$$\approx A_n(\omega)S_n(\omega) + V_n(\omega)$$
$$= A_n(\omega)e^{j\omega(n-1)t_s}S_1(\omega) + V_n(\omega)$$

With proper phase compensation $e^{-j\omega(n-1)t_s}$ 540, we combine all N spectra to form the stator current spectrum 560 in the frequency domain as $$\hat{S}_{MV}(\omega) = \sum_{n=1}^{N}\beta_n(\omega)I_n(\omega)e^{-j\omega(n-1)t_s}, \tag{19}$$

where the weight $\beta_n(\omega)$ 550 is optimized by minimum variance beam forming method, i.e., by minimizing the noise variance of spectrum at each frequency $$\min_{\beta_n}\sum_n \left\|\beta_n(\omega)I_n(\omega)e^{-j\omega(n-1)t_s}\right\|^2, \text{ s.t. } \sum_n\beta_n(\omega) = 1. \tag{20}$$

Let the vector of weight $\beta_n(\omega)$ 550 be $$w=[\beta_1(\omega), \ldots, \beta_n(\omega), \ldots, \beta_N(\omega)] \in R^{N\times 1}, \tag{21}$$

$$R=\text{diag}\{I_1^2(\omega), \ldots, I_2^n(\omega), \ldots, I_2^N(\omega)\} \in R^{N\times N}, \tag{22}$$

and $\alpha=[1, \ldots, 1, \ldots, 1]^T \in R^{N\times I}$. \tag{23}

Then the optimization problem in (20) is reformulated as a standard minimum-variance beamforming problem $$\min_w w^T R w \text{ s.t. } w^T a = 1. \tag{24}$$

The closed-form solution of (20) is given by 550

$$w = \frac{R^{-1}a}{a^T R^{-1} a}. \tag{25}$$

Note that w is frequency dependent, meaning for each frequency we solve (25) to get a different w. Once we have the estimated spectrum $S(\omega)$ 425, fault signature will be extracted 430 at different frequency according to (1)-(8). If the fault signature magnitude is greater than a certain value in 440, for example −70 dB compared to the operating signal for early-stage fault, the computer-implemented fault detection method/program generates a fault signature code that indicates that a fault (fault signature) is detected. In this case, the fault signature code indicates one of severity levels of the fault based on the fault signature magnitude. For instance, the severity levels are determined by three levels corresponding to a normal level (<−70 dB), a warning level (≈−60 dB), and a sever (critical) level (>−40 dB). Then the corresponding control signal 450 is sent to controller 220 to control the induction machine 200. If no fault is detected, the fault detection system 100 is configured to keep receiving/acquiring the operating current (stator current 410) of the induction machine 200 from the current sensor 150 via the sensor interface 130 to keep monitoring the stator current 410. While acquiring the operation current 410 from the current sensor 150 via the sensor interface 130, the fault detection system (circuitry module) 100 keeps generating and transmitting status data of the severity level of the induction machine to the user interface 140 that causes the display unit to display the message information (status information) of the severity level. In some cases, an operation transmits a control signal to the controller 220 via the network 250 using the keyboard connected to the user interface 140 to control the rotation speed of the induction machine 220 in response to the displayed status information of the severity level of the induction machine 220.

Further, when the severity level of the induction machine is equal to or greater than a critical threshold level, the fault detection system transmits a control signal to the controller 220 of the induction machine 200 via the network 250 to decrease a rotation speed of the induction machine 200 or stop operating the induction machine 200.

To validate our proposed method, eccentricity fault is considered as an example for MCSA-based analysis. Experiments are carried out in lab using a motor with eccentricity fault. In order to generate eccentricity of the rotor, two bearings that support the rotor are taken out and replaced by two external ones fixed outside the motor such that the air gap can be manually adjusted within a certain range. Four gap sensors are placed in the stator part to monitor the horizontal and vertical air gaps at both ends to make sure the accuracy of adjustment. A magnetic powder brake is used as the load whose torque can be tuned by changing its input operating current. A diagram of our experiment setup is shown in FIG. 1A. During operation, the three-phase time-domain stator current is recorded for further analysis.

To simulate early-stage eccentricity fault, we set the eccentricity level to 3%, where the eccentricity level is defined by $$y := \frac{d}{\delta_0} \times 100\%, \tag{26}$$

where d is the distance between the actual rotor axis and the ideal rotor and $\delta_0$ is the average air gap length in the corresponding healthy motor. When d=0, meaning the rotor and the stator are coaxial, the motor is heathy, as shown in FIG. 2A. When d≠0, meaning the rotor and the stator are not coaxial, the motor is faulty, as shown in FIG. 2B. Experiments are conducted under various load conditions by adjusting the input operating current of the magnetic powder brake.

Figure 3:
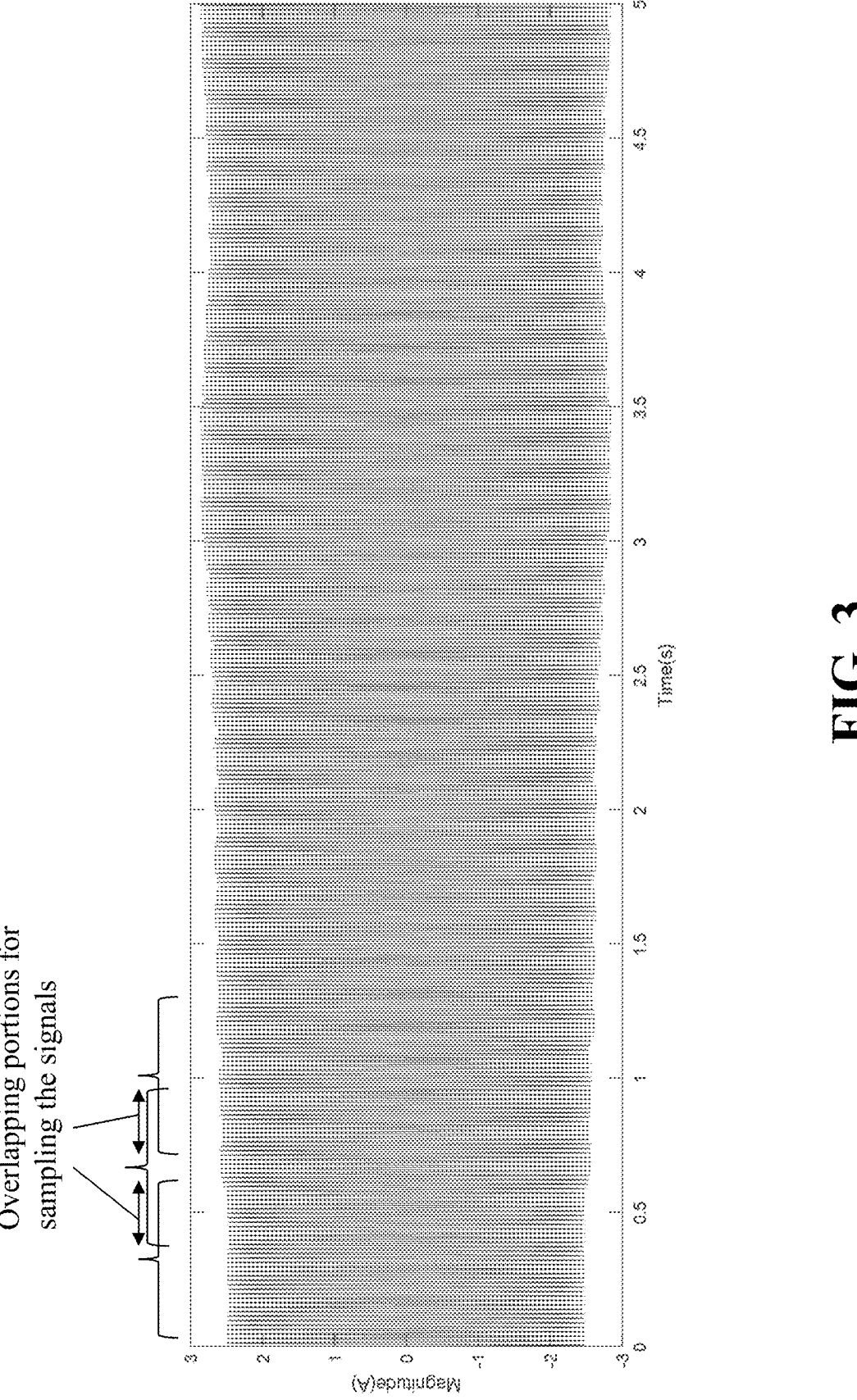
FIG. 3 is an exemplar plot of stator current in the time-domain.

The fault-detection circuitry module 100 is configured to collect stator current of 60s with sampling rate $f_{sa}$=10 kHz for different load conditions. FIG. 3 plots two examples of collected time-domain stator current data when we have a constant load and a varying load respectively. We observe that the amplitude of the current under the constant load condition is relatively flat, while varies greatly in varying load conditions. It is of great interest but challenging to extract the fault signature from the stator current with varying amplitude. To extract the fault frequency components, we consider multiple spectral analysis methods. To achieve multi-sequence data, we segment the 60s time sequence data into $t_w$=4s sequences with time step $t_s$=0.02s.

Figures 6A, 6B, 6C:
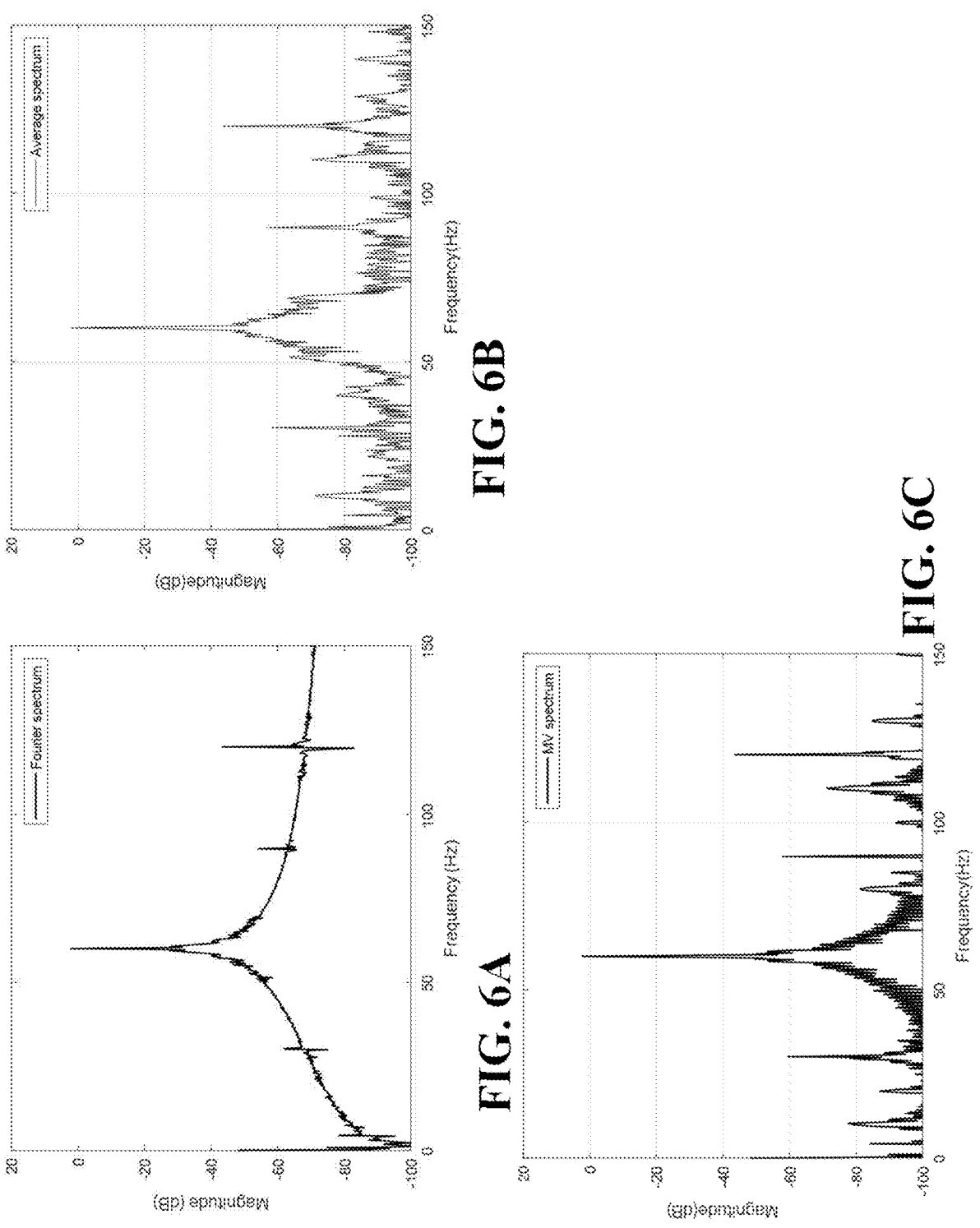
FIG. 6A, FIG. 6B, and FIG. 6C are exemplar plots of stator current spectrum at one load condition using Fourier transform spectrum, the averaged spectrum, and minimum variance (MV) spectrum, respectively.
Figures 7A, 7B, 7C:
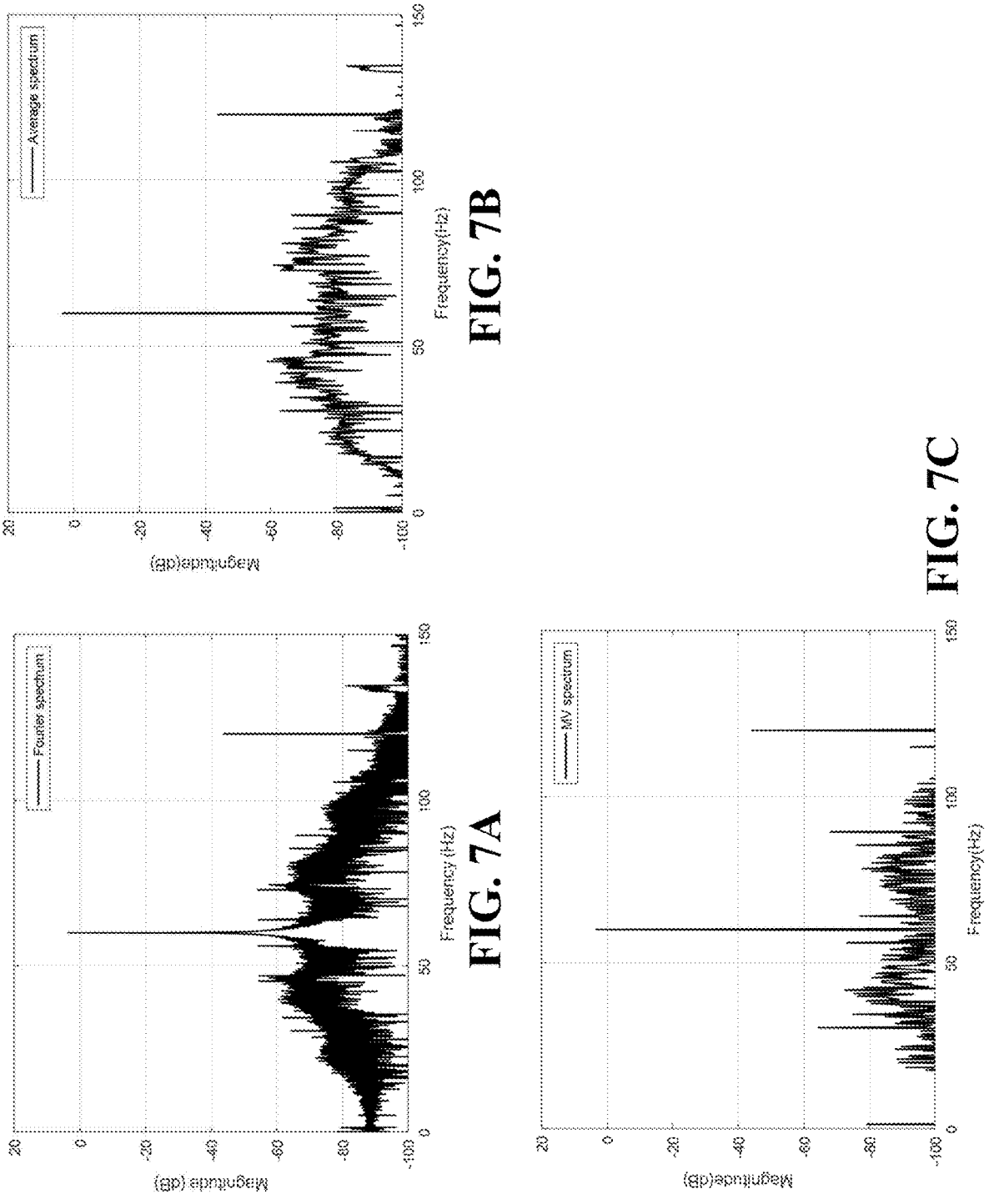
FIG. 7A and FIG. 7B, and FIG. 7C show exemplar plots of stator current spectrum at another load condition using Fourier transform spectrum, the averaged spectrum, and the minimum variance (MV) spectrum, respectively.
Figures 8A, 8B, 8C:
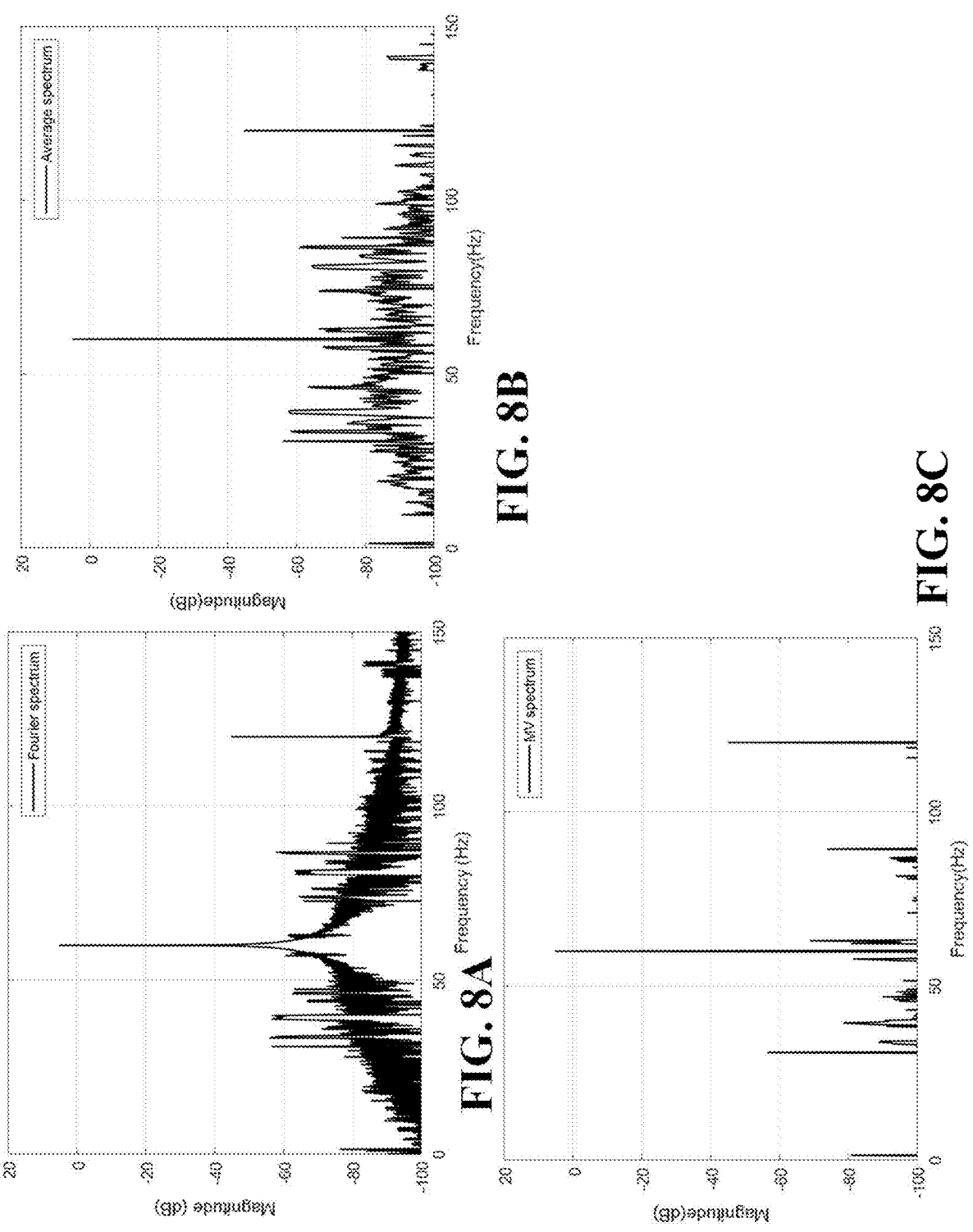
FIG. 8A and FIG. 8B, and FIG. 8C show exemplar plots of stator current spectrum at another load condition using Fourier transform spectrum, the averaged spectrum, and the minimum variance (MV) spectrum, respectively.

FIG. 6A, FIG. 6B, and FIG. 6C show exemplar plots of stator current spectrum at one load condition using Fourier transform spectrum $\hat{S}_F(\omega)$, the averaged spectrum $\hat{S}_{avg}(\omega)$, and minimum variance (MV) spectrum $\hat{S}_{MV}(\omega)$, respectively; FIG. 7A, FIG. 7B, and FIG. 7C show exemplar plots of stator current spectrum at another load condition using Fourier transform (FT) spectrum $\hat{S}_F(\omega)$, the averaged spectrum $\hat{S}_{avg}(\omega)$, and minimum variance (MV) spectrum $\hat{S}_{MV}(\omega)$, respectively; and FIG. 8A and FIG. 8B, and FIG. 8C show exemplar plots of stator current spectrum at another load condition using Fourier transform spectrum $\hat{S}_F(\omega)$, the averaged spectrum $\hat{S}_{avg}(\omega)$, and minimum variance (MV) spectrum $\hat{S}_{MV}(\omega)$, respectively.

We can observe that the FM spectrum failed to detect the fault signature under varying load conditions. While the averaged spectrum reduces noise to some extent and works well in some cases but not consistently, the MV spectrum achieved by our proposed method consistently detects the fault signature components successfully for different varying loads, which in our case are 30 Hz and 90 Hz frequency components for eccentricity. In other words, a frequency range of the MV spectrum is set to indicate the fault signatures at 30 Hz and 90 Hz frequency components for eccentricity.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

I claim:

1. A fault detection system for extracting fault signatures of an induction machine operating at varying load or varying speed conditions, comprising:
   a sensor interface configured to acquire a time-domain operation signal of the induction machine;
   a memory configured to store computer executable instructions; and
   a digital signal processor configured to execute the computer executable instructions to:
      segment the operation signal by time-windows into a plurality of segments, wherein each segment of the plurality of segments of the operation signal includes at least one overlapped time period with respect to at least one neighboring segment of the plurality of segments of the operation signal;
      convert each segment of the plurality of segments of the operation signal into a respective frequency spectrum;
      shift a phase of the respective frequency spectrum of each segment of the plurality of segments by a preset phase;
      generate a stator current spectrum for the induction machine based on a weighted sum of the respective phase shifted frequency spectrum of each segment of the plurality of segments of the operation signal, wherein the respective phase shifted frequency spectrum of each segment of the plurality of segments has a different weight in the weighted sum assigned according to a minimum variance beam-forming method;
      extract at least one fault signal frequency component from the stator current spectrum; and
      generate fault data for the induction machine based on the at least one fault signal frequency component.

2. The fault detection system of claim 1, wherein the sensor interface is configured to iteratively acquire the operation signal for a predetermined time period.

3. The fault detection system of claim 1, wherein the digital signal processor is configured to collect the operation signal for 60 seconds with a sampling rate of 10 kHz or at least double of the highest frequency of the operation signal.

4. The fault detection system of claim 1, wherein the operation signal is stator current of the induction machine.

5. The fault detection system of claim 1, wherein the stator current spectrum is a minimum variance (MV) spectrum.

6. The fault detection system of claim 5, wherein a frequency range of the MV spectrum indicates the fault signatures at 30 Hz and 90 Hz frequency components for eccentricity.

7. The fault detection system of claim 1, wherein a site of the induction machine is separated from a site of the fault detection system, wherein data communication between the site of the induction machine and the site of the fault detection system is performed via a network, wherein the network is an optical fiber network, a wireless network, an internet network, or a data communication network consisting of at least two combinations among the optical fiber network, the wireless network, and the internet network.

8. The fault detection system of claim 1, wherein the fault data indicates a severity level of a fault in the induction machine, and wherein when the severity level of the induction machine is equal to or greater than a critical threshold level, the digital signal processor is further configured to transmit a control signal to a controller of the induction machine to alter a rotation speed of the induction machine or stop operating the induction machine.

9. A computer-implemented fault detection method for extracting fault signatures of an induction machine operating at varying load or varying speed conditions, comprising steps of:

acquiring a time-domain operation signal of the induction machine via a sensor interface;

segmenting the operation signal by time-windows into a plurality of segments, wherein each segment of the plurality of segments of the operation signal includes at least one overlapped time period with respect to at least one neighboring segment of the plurality of segments of the operation signal;

converting each segment of the plurality of segments of the operation signal into a respective frequency spectrum;

shifting a phase of the frequency spectrum of each segment of the plurality of segments by a preset phase;

generating a stator current spectrum for the induction machine based on a weighted sum of the respective phase shifted frequency spectrum of each segment of the plurality of segments of the operation signal, wherein the phase shifted frequency spectrum of each segment of the plurality of segments has a different weight in the weighted sum assigned according to a minimum-variance beam-forming method;

extracting at least one fault signal frequency component from the stator current spectrum; and generating fault data for the induction machine based on the at least one fault signal frequency component.

10. The computer-implemented fault detection method of claim 9, wherein the sensor interface iteratively acquires the operation signal for a predetermined time period.

11. The computer-implemented fault detection method of claim 9, further comprises collecting, using a digital signal processor, data of the operation signal for 60 seconds with sampling rate of 10 kHz or at least double of the highest frequency of the operation signal.

12. The computer-implemented fault detection method of claim 9, wherein the operation signal is stator current of the induction machine.

13. The computer-implemented fault detection method of claim 9, wherein the stator current spectrum is a minimum variance (MV) beam-forming spectrum.

14. The computer-implemented fault detection method of claim 13, wherein a frequency range of the MV spectrum indicates the fault signatures at 30 Hz and 90 Hz frequency components for eccentricity.

15. The computer-implemented fault detection method of claim 9, wherein a site of the induction machine is separated from a site of the fault detection system, wherein data communication between the site of the induction machine and the site of the fault detection system is performed via a network, wherein the network is an optical fiber network, a wireless network, an internet network, or a data communication network consisting of at least two combinations among the optical fiber network, the wireless network, and the internet network.

16. The computer-implemented fault detection method of claim 9, wherein the fault data indicates a severity level of a fault in the induction machine, and wherein when a severity level of the induction machine is equal to or greater than a critical threshold level, the fault detection method further comprises transmitting a control signal to a controller of the induction machine to alter a rotation speed of the induction machine or stop operating the induction machine.

* * * * *